(12) United States Patent
Abbott et al.

(10) Patent No.: US 7,148,085 B2
(45) Date of Patent: Dec. 12, 2006

(54) GOLD SPOT PLATED LEADFRAMES FOR SEMICONDUCTOR DEVICES AND METHOD OF FABRICATION

(75) Inventors: Donald C. Abbott, Norton, MA (US); Paul R. Moehle, Seekonk, MA (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 10/724,498

(22) Filed: Dec. 1, 2003

(65) Prior Publication Data
US 2004/0113241 A1 Jun. 17, 2004

(51) Int. Cl.
*H01L 21/44* (2006.01)
*H01L 21/48* (2006.01)
*H01L 21/50* (2006.01)

(52) U.S. Cl. ..................... 438/123; 438/612

(58) Field of Classification Search .......... 438/123, 438/106, 121, 650, 686–687, 698, 612, 617, 438/124, 126, 127, 648; 257/666, 675–678, 257/690, 692, 693, 696, 698, 712–713, 762, 257/674, 677, 766, 772, 779
See application file for complete search history.

(56) References Cited

U.S. PATENT DOCUMENTS

| | | | | |
|---|---|---|---|---|
| 3,819,497 A * | 6/1974 | Grunwald et al. | .......... | 205/126 |
| 4,137,546 A | 1/1979 | Frusco | .......... | 357/70 |
| 4,754,317 A | 6/1988 | Comstock et al. | .......... | 357/70 |
| 5,198,964 A | 3/1993 | Ito et al. | .......... | 361/386 |
| 5,234,866 A | 8/1993 | Okinaga et al. | .......... | 437/209 |
| 5,360,991 A | 11/1994 | Abys et al. | .......... | 257/666 |
| 5,521,432 A | 5/1996 | Tsuji et al. | .......... | 257/677 |
| 5,554,569 A | 9/1996 | Ganesan et al. | .......... | 437/207 |
| 5,675,177 A | 10/1997 | Abys et al. | .......... | 257/666 |
| 5,677,566 A | 10/1997 | King et al. | .......... | 257/666 |
| 5,801,436 A | 9/1998 | Serizawa | .......... | 257/677 |
| 5,935,719 A | 8/1999 | Abbott | .......... | 428/669 |
| 5,946,556 A | 8/1999 | Hashizume | .......... | 438/126 |
| 5,958,607 A | 9/1999 | Kim et al. | .......... | 428/675 |
| 5,994,767 A * | 11/1999 | Huang et al. | .......... | 257/666 |
| 6,078,104 A | 6/2000 | Sakurai | .......... | 257/738 |
| 6,087,712 A | 7/2000 | Kim et al. | .......... | 257/666 |
| 6,150,711 A | 11/2000 | Kom et al. | .......... | 257/677 |
| 6,159,775 A | 12/2000 | Kazuto et al. | .......... | 438/123 |
| 6,194,777 B1 | 2/2001 | Abbott et al. | .......... | 257/666 |
| 6,232,651 B1 | 5/2001 | Lee et al. | .......... | 257/666 |
| 6,245,448 B1 * | 6/2001 | Abbott | .......... | 428/670 |
| 6,281,568 B1 | 8/2001 | Glenn et al. | .......... | 257/684 |
| 6,287,896 B1 | 9/2001 | Yeh et al. | .......... | 438/123 |
| 6,306,685 B1 | 10/2001 | Liu et al. | .......... | 438/121 |
| 6,358,772 B1 | 3/2002 | Miyoshi | .......... | 438/106 |
| 6,358,778 B1 | 3/2002 | Shinohara | .......... | 438/123 |

FOREIGN PATENT DOCUMENTS

| | | |
|---|---|---|
| JP | 02-234833 | 4/1992 |
| JP | 2000-77593 | * 3/2000 |

* cited by examiner

*Primary Examiner*—Hoai Pham
*Assistant Examiner*—DiLinh Nguyen
(74) *Attorney, Agent, or Firm*—Yingsheng Tung; Wade James Brady, III; Frederick J. Telecky, Jr.

(57) ABSTRACT

A leadframe for use with integrated circuit chips comprising a plated layer of gold selectively covering areas of said leadframe intended for solder attachment; and said gold layer providing a visual distinction to said areas.

6 Claims, 2 Drawing Sheets

GOLD SPOT PLATED LEADFRAMES FOR SEMICONDUCTOR DEVICES AND METHOD OF FABRICATION

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 µm) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent #0 335 608 B1, issued 14 Jun. 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Unfortunately, palladium is expensive; its price climbed in the last decade from about one third of the gold price to about 20% higher than gold. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability. A method introduced in semiconductor manufacturing uses a thin layer of gold on the palladium surface to prevent oxidation. One related example is described in U.S. Pat. No. 5,859,471, issued on Jan. 12, 1999 (Kuraishi et al., "Semiconductor Device having TAB Tape Leadframe with Reinforced Outer Leads").

In these methods, however, the entire surfaces of the leadframe are plated with gold. This practice severely inhibits the adhesion of the leadframe segments to molding compounds and risks delamination in thermomechanical stress testing. Furthermore, the plating of the complete leadframe with a thin gold layer makes it impossible to decide by visual inspection whether a leadframe has the gold surface or not. Such standard simple inspection, however, is highly desirable as manufacturing practice. Finally, the deposition of gold in unnecessary areas is counterproductive to cost saving efforts.

An urgent need has therefore arisen for a low-cost, reliable mass production method for a leadframe having reduced palladium layer thickness combined with solderability, bondability, adhesion capability to molding compounds, and visual inspection contrasts. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, a plated layer of gold selectively covers areas of the leadframe intended for soldering, providing a visual distinction to those areas and optimizing solder attachment. While this layer of gold is very thin and thus barely adds to the leadframe cost, it enables substantial savings of underlying plated metals without diminishing the leadframe quality for wire bonding and for adhesion to molding compounds.

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, digital and analog devices, high frequency and high power devices, and both large and small area chip categories. The invention represents a significant cost reduction of the semiconductor packages, especially the plastic molded packages, compared to the conventional copper-based palladium-plated leadframes.

It is an aspect of the present invention to provide a technology for reducing the thickness of costly noble metal, especially palladium, layers while simultaneously improving the solderability the leadframe and maintaining its reliable adhesion to plastic molding compounds.

Another aspect of the invention is to reach these goals without the cost of equipment changes and new capital investment, by using the installed fabrication equipment base.

Another aspect of the present invention is to introduce a manufacturing quality check based on a simple, low-cost visual inspection. This check insures the selection of the correct leadframe and its appropriate preparation before releasing it into the assembly process flow.

These aspects have been achieved by the teachings of the invention concerning masking and deposition methods suitable for mass production. Various modifications of leadframe preparations have been successfully employed.

In the first embodiment of the invention, the frequently used layer sequence of first nickel, palladium-nickel alloy, second nickel and palladium is modified so that the palladium layer thickness is reduced across the entire leadframe and a thin layer of gold is selectively plated on lead segment areas intended for solder attachment, preventing the oxidation of the underlying nickel and thus preserving its solderability.

In the second embodiment of the invention, the first nickel layer and the palladium-nickel alloy layer are omitted. Again, solderability, bondability, adhesion to plastics, and corrosion insensitivity are demonstrated.

Leadframes prepared according to the invention can be successfully used in surface mount technologies based on bending the package lead segments.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
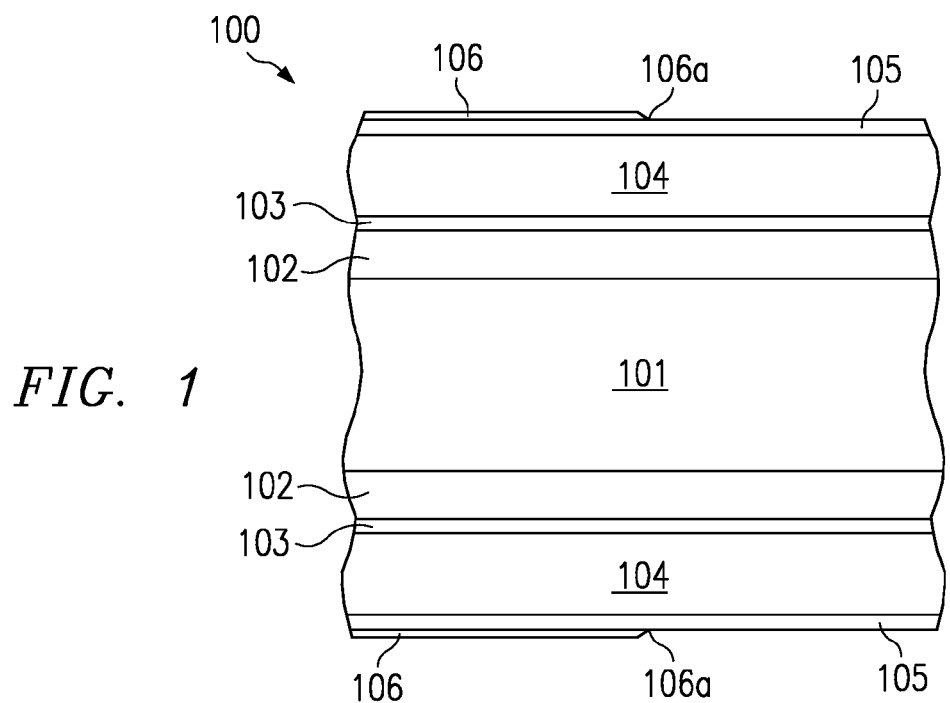
FIG. 1 is a schematic cross sectional view of a portion of a leadframe made according to the first embodiment of the invention.

The present invention is related to the assembly of semiconductor ICs on leadframes and their final encapsulation, the sequential construction of these leadframes using deposited layers of various metals, and the process of fabricating these leadframes so that they offer quality-related visual inspection and reliable solder attachment to substrates.

The invention reduces the cost of leadframes while the leadframe functions are maximized. The invention best applies to any leadframe and any substrate used in semiconductor technology which exhibit the following design features: Usually, a chip pad for support of the IC chip surrounded by lead segments having an inner tip in proximity of the chip pad, and outer tips remote from the chip pad. The invention thus applies to semiconductor package types such as PDIPs, SOICs, QFPs, SSOPs, TQFPs, TSSOPs and TVSOPs.

For PDIPS, the gold spot is applied to both sides of the outer segments. For gull wing devices (see below FIG. 3), the gold spot is only required on the surface of the segment that faces the assembly board. For J-leaded devices, the gold is on the outside of the J-bend; it may also cover the edges of the segment.

The base metal of leadframes is typically copper or copper alloys. Other choices comprise iron-nickel alloys ("Alloy 42"), invar, or aluminum.

Leadframe segments have to satisfy five needs in semiconductor assembly:
1) Leadframes have to comprise outer segment tips for solder attachment to other parts;
2) leadframes have to comprise inner segment tips for bond attachments to wires;
3) leadframes have to comprise outer segments ductile for forming and bending the segments;
4) leadframe surfaces have to comprise adhesion to molding compounds; and
5) leadframe segments have to comprise insensitivity to corrosion.

According to the teachings of this invention, Need 1) is satisfied by selectively depositing a layer of gold where, and only where, a solder joint has to be made. This gold layer is plated over a layer of a noble metal, usually palladium, which is intentionally made thin. While at this thinness, the palladium would not prevent the oxidation of the underlying nickel, together with the thin gold layer such protection is provided and the solderablilty of the nickel guaranteed.

As stated above, the final form of the outer lead segments after bending determines where the gold is required.

The invention satisfies Need 2) by the choice of the noble metal layer employed to fulfill Need 1). For palladium, a thin layer is sufficient for reliable bonding wire attachment (stitch bonds, ball bonds, or wedge bonds).

The invention satisfies Need 3) by the selection of thickness and structure of the nickel layer employed to fulfill need 1). Thickness and deposition method of the nickel layer have to be selected such that the layer insures ductility and enables the bending and forming of the outer lead segments.

The invention satisfies Need 4) by the choice of the noble metal layer employed to fulfill need 1); a practical selection is palladium with its excellent adhesion to thermoset molding compounds and other encapsulation materials. From the standpoint of maximum adhesion, it is an advantage that the invention avoids gold inside the finished package.

The invention satisfies Need 5) by the sequence of layers deposited over the copper base. The optimum corrosion insensitivity is achieved by the layer sequence described in FIG. 1.

In the embodiment of the invention in FIG. 1, the schematic cross section of a leadframe portion according to the invention is generally designated 100. The copper or copper alloy base sheet 101 has a preferred thickness in the range from 100 to 300 µm; thinner sheets are possible. The ductility in this thickness range provides the 5 to 15% elongation needed in the segment bending and forming operation. The leadframe is stamped or etched from the starting metal sheet. The stamped or etched leadframe is first immersed in an alkaline preclean solution at 20 to 90° C. for few seconds up to 3 minutes. Oils, grease, soil, dirt and other contamination are thereby removed.

After rinsing, the leadframe is next immersed in an acid activation bath at room temperature for few seconds up to 5 minutes. The bath consists of a solution of sulfuric acid, hydrochlorid acid, or other acid solution, preferably at about 30 to 60 g/l concentration. This solution removes copper oxide and leaves the metallic copper oxide surface in an activated state, ready to accept the deposition of metallic nickel.

The nickel layer 102 is electroplated to a thickness in the range between about 50 and 150 nm. The next deposited layer 103 is an alloy between nickel and a noble metal selected from a group consisting of palladium, rhodium, gold silver, and platinum. The preferred choice is palladium, with 60 to 80% palladium. The alloy layer is deposited by electroplating and between about 25 and 150 nm thick; it should be coherent since its main purpose is corrosion protection.

The important layer 104 is electroplated nickel, deposited preferably for a thickness of about 0.5 to 3 µm. This nickel layer has to be ductile in order to be malleable in the leadframe segment bending and forming process. Further, the nickel surface has to be wettable in the soldering process, so that solder alloys or conductive adhesives can be used successfully.

The overall thickness of the two nickel layers and the nickel alloy layer is in the range of about 650 to 4000 nm.

The next deposited layer of the embodiment in FIG. 1 is the layer 105, comprising an electroplated noble metal selected from a group consisting of palladium, rhodium, gold and silver. The preferred embodiment is palladium; however, if minimum interdiffusion with solder is desired, layer 105 may also consist of platinum. Since the cost of palladium has increased significantly in the last few years, it is important that the present invention reduces its thickness from the value it customarily had (about three times larger). According to the invention, layer 105 is preferably between about 10 and 30 nm thick, when palladium is chosen.

In this thickness range, palladium is suitable for all wire bonding attachments (stitch bonds, ball bonds, and wedge bonds) and retains its excellent adhesion to thermoplastic molding compounds—an attribute crucial for avoiding package delamination and progressive corrosion.

The outermost layer of the embodiment in FIG. 1 is layer 106, comprising selectively plated gold in the thickness range of about 2 to 5 nm. Its purpose is to prevent surface oxidation of the underlying layer 104 wherever solder joints are to be made. As FIG. 1 shows, a mask, covering portions of layer 105, allows the gold deposition beginning at a limit 106a so that the gold is spot-plated in the areas where solderablility is required.

In this thickness range, gold not only reliably provides good solderablilty, but also provides a visual distinction between the gold-plated areas and the adjacent palladium or nickel surfaces without gold deposition. This contrast between covered and uncovered areas can readily be seen by the unaided eye and is, therefore, well suited for automated visual inspection in manufacturing process control, contributing to product quality assurance.

There are several methods to selectively deposit metals from solution onto a continuous strip. For high volume production of leadframes, continuous strip or reel-to-reel plating is advantageous. The process steps of the preferred methods are as follows.

Step and Repeat
  Leadframe material is stopped in selective plating head;
  rubber mask system clamps on material;
  plating solution is jetted at material;
  current is applied;
  current is shut off;
  solution is shut off;
  head opens;
  material moves.

Advantages: Very sharp plating spot with excellent edge definition; very good spot location capability when used with index holes, pins and feedback vision system.

Disadvantages: Slow; material must stop during selective plating; expensive equipment to buy and maintain; timing issues; lots of moving parts.

Wheel System
  Material is moved over a large diameter wheel with apertures in it to allow solution flow to material;
  backing belt is used to hold material on wheel and mask backside of material;
  anode is stationary inside wheel.

Advantages: Fast, material never stops for selective plating; no timing issues; pumps, rectifiers, and drive system are on continuously; lower cost because less complicated mechanically.

Disadvantages: None for gold spot plating (poor edge shape, poor spot location, and bleedout are not critical issues).

Figure 2:
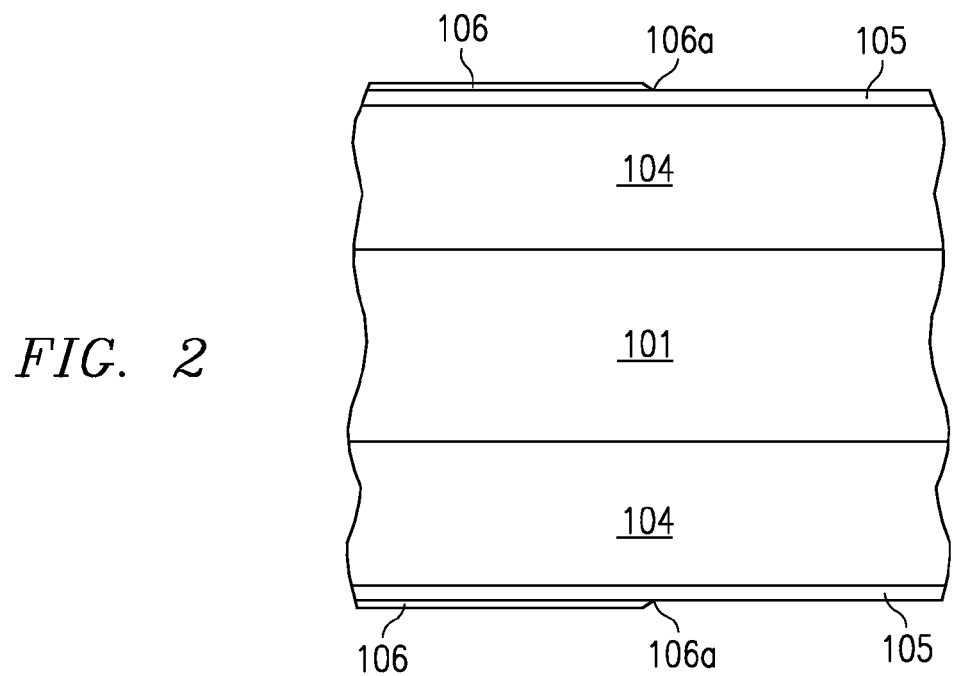
FIG. 2 is a schematic cross sectional view of a portion of a leadframe made according to the second embodiment of the invention.

In the embodiment of the invention shown in the schematic cross section of FIG. 2, the copper or copper alloy base of the leadframe is directly followed by the electroplated nickel layer 104; the additional nickel layer and the nickel/palladium alloy layer are omitted. The thickness range of nickel layer 104 is again about 0.5 to 3 µm. According to the present invention, the electroplated noble metal layer 105 (for example, palladium) is only about 10 to 30 nm thick. The outermost layer is the thin, selectively plated gold layer 106 with a preferred thickness range from about 2 to 5 nm. As FIG. 2 shows, a mask allows the gold deposition to begin at limit 106a so that the gold is spot-plated in the areas where solderability is required.

Figure 3:
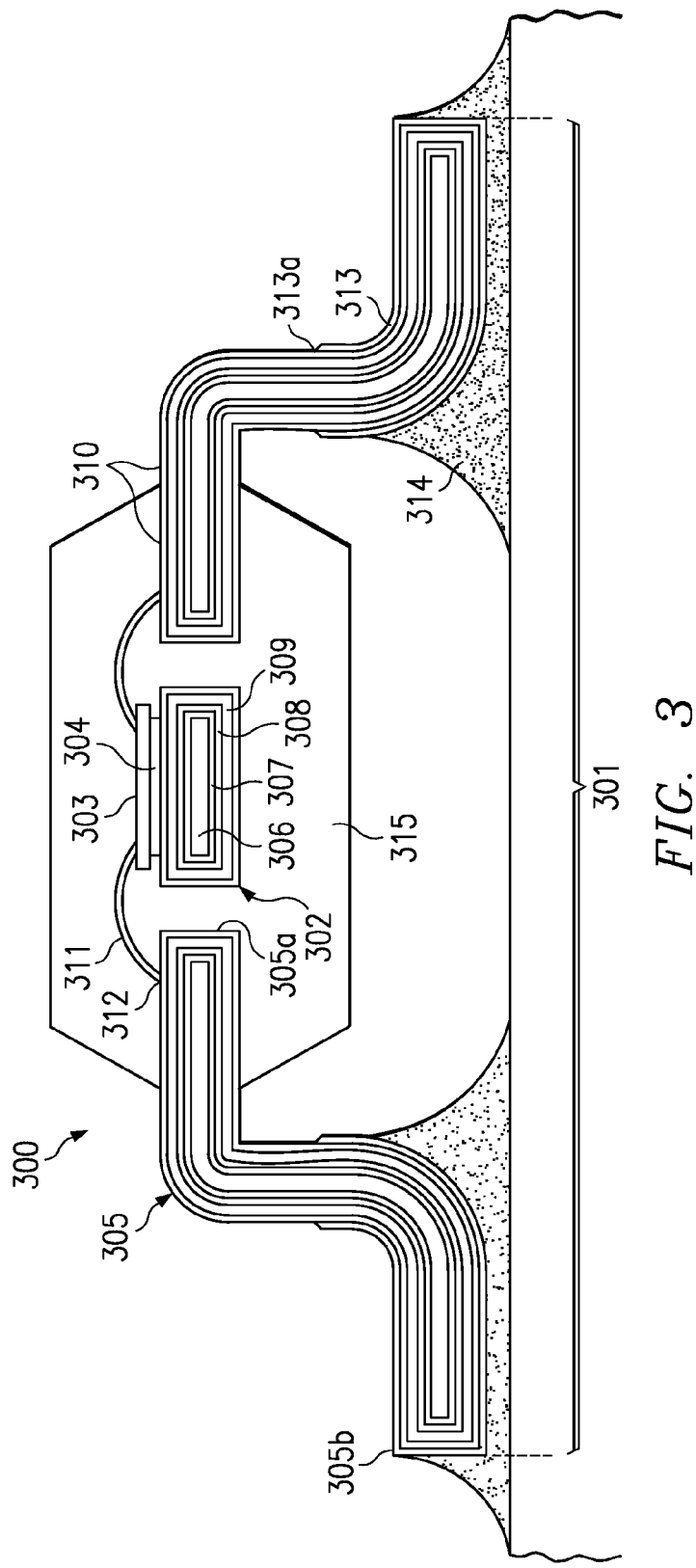
FIG. 3 is a schematic and simplified cross sectional view of a package semiconductor device having a leadframe according to the invention, solder assembled on a substrate.

In the schematic cross section of FIG. 3, the copper or copper alloy leadframe 301 of the invention is shown as applied in the assembly of a semiconductor package generally designated 300. Leadframe 301 has a chip mount pad 302 onto which an IC chip 303 is attached using adhesive material 304 (typically an epoxy or polyimide which has to undergo polymerization). Leadframe 301 further has a plurality of lead segments 305. These lead segments have a first end 305a near the chip mount pad 302 and their second end 305b remote from mount pad 302.

As shown in FIG. 3 schematically, leadframe 305 comprises base 306 made of copper or copper alloy. On the surface of this copper is a sequence of layers, described in detail in FIG. 1. Closest to the copper is a first layer 307 of nickel. This layer is followed by an alloy layer 308 made of nickel and a noble metal, preferably palladium, and a second layer 309 of nickel. The top layer inside the package and on some portions of lead segments 305 is layer 310, made of a noble metal, preferably palladium.

As described in conjunction with FIG. 1, this sequence of layers provides reliable protection against corrosion, reliable adhesion to the plastic encapsulation compound, and reliable wire bonding for connecting the chip contact pads to the leadframe segments. In FIG. 3, bonding wires 311 have stitches 312 welded to the palladium surface 310 of leadframe segments 305. The bonding wires are selected from a group consisting of gold, copper, aluminum, and alloys thereof. Any of these metals provide reliable welds to the layered leadframes of the invention.

As shown in FIG. 3, the second ends 305b of segments 305 are suitable for bending and forming due to the ductility of the copper base and the electroplated nickel layer. Using this malleable characteristic, segments 305 may be formed in any shape required for surface mounting or any other technique of board attach of the semiconductor devices. The bending of the segments does not diminish the corrosion protection of the second segment ends 305b. For example, FIG. 3 indicates a so-called "gull wing shape" of segments 305. This shape is widely used for IC packages in the so-called "small outline" configuration, as illustrated in FIG. 3.

Outermost layer 313 in FIG. 3 is the spot-plated thin gold layer of the present invention. This gold layer covers the area of the outer segment ends 305b where the solder joints are made. Due to border line 313a, the gold can be distinguished from the palladium and nickel surface near the plastic outline. In an embodiment different from FIG. 3, the gold of gull-wing devices covers only the surface of the segments that face the assembly board; in this case, the gold can also be distinguished from the palladium surface when compared to the reverse side of the segment.

The gold spot-plated copper leadframe of the invention provides for easy and reliable solder attachment to boards or other parts of the formed leadframe segments. In FIG. 3, solder attach material 314 comprises materials selected from a group consisting of tin/lead mixture, tin/indium, tin/silver, tin/bismuth, and conductive adhesive compounds. When palladium is selected as the metal of layer 310, it may be dissolved (not shown in FIG. 3) into the solder material during the attachment process so that direct solder wetting to the nickel layer 309 is achieved.

In FIG. 3, molding compound 315 encapsulates the mounted chip 303, bonding wires 311 and the first ends 305a of the lead segments 305. The second, remote ends 305b of the segments are not included in the molded package; they remain exposed for solder attachment. Typically, the encapsulation material 315 is selected from a group consisting of epoxy-based molding compounds suitable for adhesion to layer 310 of the leadframe. For palladium, excellent adhesion characteristics to molding compounds can be achieved, preventing package delamination, moisture ingress and corrosion.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the design, cover area and fabrication method of the gold layer may be modified to suit specific leadframe or substrate needs. It is therefore intended that the appended claims encompass any such modifications or embodiments.

We claim:

1. A method for fabricating a leadframe comprising the steps of:
    providing a copper leadframe having a mount pad for an integrated circuit chip and a plurality of lead segments having their first end near said mount pad and their second end remote from said mount pad;
    cleaning said leadframe in alkaline soak cleaning and alkaline electro cleaning;
    activating said leadframe by immersing said leadframe into an acid solution, thereby dissolving any copper oxide;
    immersing said leadframe into an electrolytic nickel plating solution and depositing a first layer of nickel onto said copper;
    electroplating a layer comprising an alloy of nickel and palladium;
    electroplating a second layer of nickel, thereby adapting said lead segments for mechanical bending;
    electroplating a layer of palladium;
    selectively masking said chip pad and said first segment ends, thereby leaving said second segment ends exposed; and
    plating a layer of gold on said exposed segment ends in a thickness suitable to optimize solder attachment, thereby creating a visual distinction between the gold-plated and unplated leadframe areas.

2. The method according to claim 1 wherein said gold plating is performed electrolytically or electrolessly.

3. The method according to claim 1 wherein said masked parts of said leadframe comprise the leadframe areas to be encapsulated by molding compound.

4. The method according to claim 1 wherein the process steps are executed in sequence without time delays, yet including intermediate rinsing steps.

5. The method according to claim 1 wherein said acid solution may be sulfuric acid, hydrochloric acid or any other acid.

6. A method for fabricating a leadframe comprising the steps of:
    providing a copper leadframe having a mount pad for an integrated circuit chip and a plurality of lead segments having their first end near said mount pad and their second end relatively remote from said mount pad;
    cleaning said leadframe in alkaline soak cleaning and alkaline electro cleaning;
    activating said leadframe by immersing said leadframe into an acid solution to dissolve any copper oxide;
    electroplating a layer of nickel to adapt said lead segments for mechanical bending;
    electroplating a layer of palladium;
    selectively masking said chip pad and said first segment ends to leave said second segment ends exposed; and
    plating a layer of gold on said exposed segment ends in a thickness suitable to optimize solder attachment to create a visual distinction between the gold-plated and unplated leadframe areas.

* * * * *